(12) United States Patent
Yang et al.

(10) Patent No.: US 9,800,243 B2
(45) Date of Patent: Oct. 24, 2017

(54) CLOCK CIRCUIT AND CLOCK SIGNAL TRANSMISSION METHOD THEREOF

(71) Applicant: Huawei Technologies Co., Ltd., Shenzhen (CN)

(72) Inventors: Shengli Yang, Xi'an (CN); Xing Huang, Xi'an (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/410,972

(22) Filed: Jan. 20, 2017

(65) Prior Publication Data

US 2017/0214405 A1   Jul. 27, 2017

(30) Foreign Application Priority Data

Jan. 21, 2016   (CN) .......................... 2016 1 0041841

(51) Int. Cl.

| | |
|---|---|
| *H03K 19/00* | (2006.01) |
| *H03K 19/0175* | (2006.01) |
| *H03K 19/173* | (2006.01) |
| *G06F 1/06* | (2006.01) |
| *G06F 1/10* | (2006.01) |
| *G06F 5/16* | (2006.01) |

(52) U.S. Cl.
CPC ........... *H03K 19/0016* (2013.01); *G06F 1/06* (2013.01); *G06F 1/10* (2013.01); *G06F 5/16* (2013.01); *H03K 19/0175* (2013.01); *H03K 19/1737* (2013.01); *G06F 2217/62* (2013.01); *H03K 2217/0054* (2013.01)

(58) Field of Classification Search
CPC .... G01R 13/318552; G01R 31/318594; G01R 31/31725; H03K 19/1737; H03K 19/096; H03K 19/17744; H03K 19/00315; H03K 19/17748; H03K 5/01; G06F 1/04; G06F 1/06; G06F 2217/62; G11C 7/222
See application file for complete search history.

(56) References Cited

U.S. PATENT DOCUMENTS 7,279,950 B2 * 10/2007 Cranford, Jr. ............. G06F 1/04
                                                   327/291
8,487,672 B2 *  7/2013 Itoh .......................... G06F 1/06
                                                   327/142
(Continued)

FOREIGN PATENT DOCUMENTS

EP         2549354 A2      1/2013
EP         2937999 A1     10/2015

*Primary Examiner* — Vibol Tan
(74) *Attorney, Agent, or Firm* — Slater Matsil, LLP

(57) ABSTRACT

A clock circuit includes a buffer module, N multiplexers, and N clock gating cells. The buffer module includes an input end and N output ends, and is configured to enhance a driving capability of a clock signal received by the input end, and output the clock signal from the N output ends, and the N output ends are connected to data ends of the N clock gating cells one to one. Output ends of the N first multiplexers are connected to enabling ends of the N clock gating cells one to one. Each clock gating cell outputs a clock signal from an output end according to a frequency division logic signal or a gating logic signal received by an enabling end from an output end of a corresponding multiplexer and the clock signal received by a data end from an output end of the buffer module.

12 Claims, 6 Drawing Sheets

(56) References Cited

U.S. PATENT DOCUMENTS

| | | | |
|---|---|---|---|
| 8,832,510 B2* | 9/2014 | Kukreja | G01R 31/318594 |
| | | | 714/729 |
| 8,836,394 B2* | 9/2014 | Zerbe | H04L 7/0079 |
| | | | 326/82 |
| 8,850,371 B2* | 9/2014 | Sprinkle | G06F 1/3237 |
| | | | 716/100 |
| 9,100,016 B2* | 8/2015 | Kim | H03K 17/284 |
| 9,362,910 B2* | 6/2016 | Gurumurthy | H03K 19/0016 |
| 9,377,511 B2* | 6/2016 | Li | G01R 31/318541 |
| 9,542,982 B1* | 1/2017 | Nguyen | G11C 5/148 |
| 2006/0039405 A1 | 2/2006 | Day et al. | |
| 2009/0201055 A1 | 8/2009 | Takano | |
| 2011/0200162 A1 | 8/2011 | Shibayama | |
| 2013/0305078 A1* | 11/2013 | Lee | G06F 1/08 |
| | | | 713/500 |
| 2014/0040465 A1 | 2/2014 | Day et al. | |

* cited by examiner

CLOCK CIRCUIT AND CLOCK SIGNAL TRANSMISSION METHOD THEREOF

CROSS-REFERENCE TO RELATED APPLICATIONS

This application claims priority to Chinese Patent Application No. 201610041841.6, filed on Jan. 21, 2016, which is hereby incorporated by reference in its entirety.

TECHNICAL FIELD

The present invention relates to the circuit field, and in particular, to a clock circuit and a clock signal transmission method thereof.

BACKGROUND

In a digital integrated circuit, data transmission between units is synchronously controlled by using a clock signal. When a clock circuit having a conventional structure is used in the digital integrated circuit, an excessively large quantity of logical units on a clock path in the clock circuit causes an excessively long propagation path of the clock signal, resulting in a relatively long clock latency and relatively high power consumption on each clock path.

SUMMARY

Embodiments of the present invention provide a clock circuit and a method for transmitting a clock signal by using the clock circuit, which can reduce clock latency, and can reduce power consumption of the clock circuit.

According to a first aspect, a clock circuit is provided, including a buffer module, N first multiplexers, and N clock gating cells, where N is a positive integer. The buffer module includes an input end and N output ends, and is configured to enhance a driving capability of a clock signal received by the input end of the buffer module, and output the clock signal whose driving capability is enhanced from the output ends of the buffer module. The N output ends of the buffer module are connected to data ends of the N clock gating cells one to one. Output ends of the N first multiplexers are connected to enabling ends of the N clock gating cells one to one, and each first multiplexer is configured to choose, according to a logic selection signal received by an address input end, whether to output, from an output end, a gating logic signal received by a first data input end or a frequency division logic signal received by a second data input end. Each clock gating cell is configured to output a clock signal from an output end according to a frequency division logic signal or a gating logic signal received by an enabling end from an output end of a corresponding first multiplexer and the clock signal received by a data end from an output end of the buffer module.

According to the clock circuit of the present invention, after traveling through a buffer module, a clock signal is directly input to a clock gating cell, and then the clock gating cell outputs the clock signal according to a frequency division logic signal and a gating logic signal that a multiplexer chooses to output, so that the clock signal can arrive at a load through only one level of clock gating cell. Therefore, a clock path is shortened, and a transmission latency of the clock signal can be reduced and power consumption of the clock circuit can be reduced. On the other hand, as the clock path is shortened, an on-chip variation (OCV) and a clock deviation can be further reduced.

In a possible implementation manner, the buffer module includes M buffers, where M is a positive integer, and M≥N, the M buffers form a tree-shaped clock structure having a root node and N leaf nodes, and paths between the root node and all the leaf nodes have an equal length. An input end of a buffer at a position of the root node is the input end of the buffer module, and output ends of N buffers at positions of the N leaf nodes are the N output ends of the buffer module.

Because a clock signal arrives at different clock gating cells through a same quantity of buffers, clock path lengths on non-common paths in the clock circuit are the same, which can further reduce a clock variation of the clock signal.

In a possible implementation manner, the clock circuit further includes a second multiplexer, where an output end of the second multiplexer is connected to the input end of the buffer module; and the second multiplexer is configured to choose, according to a clock selection signal received by an address input end, whether to output, from the output end, a clock source signal received by a first data input end or a testing clock signal received by a second data input end. The input end of the buffer module is specifically configured to receive the clock source signal or the testing clock signal that is output from the output end of the second multiplexer. Each clock gating cell is configured to: when the second multiplexer chooses to output the testing clock signal from the output end, output a clock signal from an output end according to a testing logic signal received by the testing enabling end and the testing clock signal received by the data end from the output end of the buffer module; and is configured to: when the second multiplexer chooses to output the clock source signal from the output end, output a clock signal from the output end according to the frequency division logic signal or the gating logic signal received by the enabling end from the output end of the corresponding first multiplexer and the clock source signal received by the data end from the output end of the buffer module.

According to the clock circuit of the present invention, not only a clock source signal may be input, but also a testing clock signal may be input, so that a clock gating cell may output, in an operating mode according to a gating logic signal or a frequency division logic signal, a clock signal corresponding to the clock source signal, and the clock gating cell may output, in a testing mode according to a gating logic signal or a frequency division logic signal and a testing logic signal, a clock signal corresponding to the testing clock signal.

In a possible implementation manner, each clock gating cell is an integrated clock gating cell (ICGC).

In the clock circuit of the present invention, an ICGC is used as a clock gating cell, which not only can reduce an area of a chip, but also can improve quality of a clock signal. Moreover, the clock circuit of the present invention can output a frequency division clock signal having a duty ratio of 1:(2n−1), where n is great than or equal to 1.

In a possible implementation manner, the M buffers form an H-shaped clock network structure.

In the clock circuit of the present invention, M buffers form an H-shaped clock network structure, which can further reduce power consumption of the clock circuit.

In a possible implementation manner, a high-layer metal is used for the H-shaped clock network.

In the clock circuit in the embodiments of the present invention, a high-layer metal is used for an H-shaped clock network structure, which can increase a driving distance of a buffer and reduce a length of a clock path, and therefore can reduce clock latency and improve quality of a clock signal.

According to a second aspect, a clock signal transmission method is provided, where the method is applied to a clock circuit, where the clock circuit includes a buffer module, N first multiplexers, and N clock gating cells, where N is a positive integer. The buffer module includes an input end and N output ends, and the N output ends of the buffer module are connected to data ends of the N clock gating cells one to one. Output ends of the N first multiplexers are connected to enabling ends of the N clock gating cells one to one. When the clock circuit is used to transmit a clock signal, a clock signal is input from the input end of the buffer module, and the buffer module enhances a driving capability of the clock signal, and outputs the clock signal whose driving capability is enhanced from the N output ends. A logic selection signal is input from an address input end of at least one of the first multiplexers, a gating logic signal is input from a first data end of the at least one first multiplexer, a frequency division logic signal is input from a second data end of the at least one first multiplexer, and the frequency division logic signal or the gating logic signal is output from an output end of the at least one first multiplexer according to the logic selection signal. A clock gating cell connected to the at least one first multiplexer outputs a clock signal from an output end according to the frequency division logic signal or the gating logic signal received by an enabling end from the output end of the corresponding first multiplexer and the clock signal received by a data end from an output end of the buffer module.

According to the clock signal transmission method of the present invention, after traveling through a buffer module, a clock signal is directly input to a clock gating cell, and then the clock gating cell outputs the clock signal according to a frequency division logic signal and a gating logic signal that a multiplexer chooses to output, so that the clock signal can arrive at a load through only one level of clock gating cell. Therefore, a clock path is shortened, and it is ensured that clock path lengths on different paths are the same, so that a transmission latency and a clock variation of a clock source signal can be reduced, and power consumption of a clock circuit can be reduced.

In a possible implementation manner, the buffer module includes M buffers, where M is a positive integer, and M≥N. The M buffers form a tree-shaped clock structure having a root node and N leaf nodes, and paths between the root node and all the leaf nodes have an equal length. An input end of a buffer at a position of the root node is the input end of the buffer module, and output ends of N buffers at positions of the N leaf nodes are the N output ends of the buffer module.

Because a clock signal arrives at different clock gating cells through a same quantity of buffers, clock path lengths on non-common paths in a clock circuit are the same, which can further reduce a clock variation of the clock signal.

In a possible implementation manner, the clock circuit further includes a second multiplexer. An output end of the second multiplexer is connected to the input end of the buffer module. When the clock circuit is used to transmit a clock signal, a clock selection signal is input from an address input end of the second multiplexer, a clock source signal is input from the first data input end of the second multiplexer, a testing clock signal is input from the second data input end of the second multiplexer, and the clock source signal or the testing clock signal is output from the output end. The input end of the buffer module receives the clock source signal or the testing clock signal that is output from the output end of the second multiplexer. When the second multiplexer outputs the testing clock signal from the output end, the clock gating cell connected to the at least one first multiplexer outputs a clock signal from the output end according to a testing logic signal received by the testing enabling end and the testing clock signal received by the data end from the output end of the buffer module; and when the second multiplexer outputs the clock source signal from the output end, the clock gating cell connected to the at least one first multiplexer outputs a clock signal from the output end according to the frequency division logic signal or the gating logic signal received by the enabling end from the output end of the corresponding first multiplexer and the clock source signal received by the data end from the output end of the buffer module.

According to the clock signal transmission method of the present invention, not only a clock source signal may be input, but also a testing clock signal may be input, so that a clock gating cell may output, in an operating mode according to a gating logic signal or a frequency division logic signal, a clock signal corresponding to the clock source signal, and the clock gating cell may output, in a testing mode according to a gating logic signal or a frequency division logic signal and a testing logic signal, a clock signal corresponding to the testing clock signal.

In a possible implementation manner, each clock gating cell is an ICGC.

In the clock signal transmission method of the present invention, an ICGC is used as a clock gating cell, which not only can reduce an area of a chip, but also can improve quality of a clock signal. Moreover, a clock circuit of the present invention can output a frequency division clock signal having a duty ratio of 1:(2n−1), where n is great than or equal to 1.

In a possible implementation manner, the M buffers form an H-shaped clock network structure.

In the clock signal transmission method of the present invention, M buffers form an H-shaped clock network structure, which can further reduce power consumption of a clock circuit.

With reference to the third possible implementation manner, in a fourth possible implementation manner, a high-layer metal is used for the H-shaped clock network.

In the clock signal transmission method of the present invention, a high-layer metal is used for an H-shaped clock network structure, which can increase a driving distance of a buffer and reduce a length of a clock path, and therefore can reduce clock latency and improve quality of a clock signal.

BRIEF DESCRIPTION OF THE DRAWINGS

To describe the technical solutions in the embodiments of the present invention more clearly, the following briefly describes the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

DETAILED DESCRIPTION OF ILLUSTRATIVE EMBODIMENTS

The following clearly describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

First, an application scenario of a clock circuit in the embodiments of the present invention is described below by using an example. A digital integrated circuit integrating the clock circuit in the embodiments of the present invention may be included in a processor. Processing by the processor needs to be driven by using a periodic clock pulse. That is, after a clock signal is input to the clock circuit, the clock signal is transmitted by the clock circuit, and finally drives an internal unit in the processor and/or an external device, such as a logical unit in the processor, a bus, or an input/output interface, to operate.

Figures 1, 2:
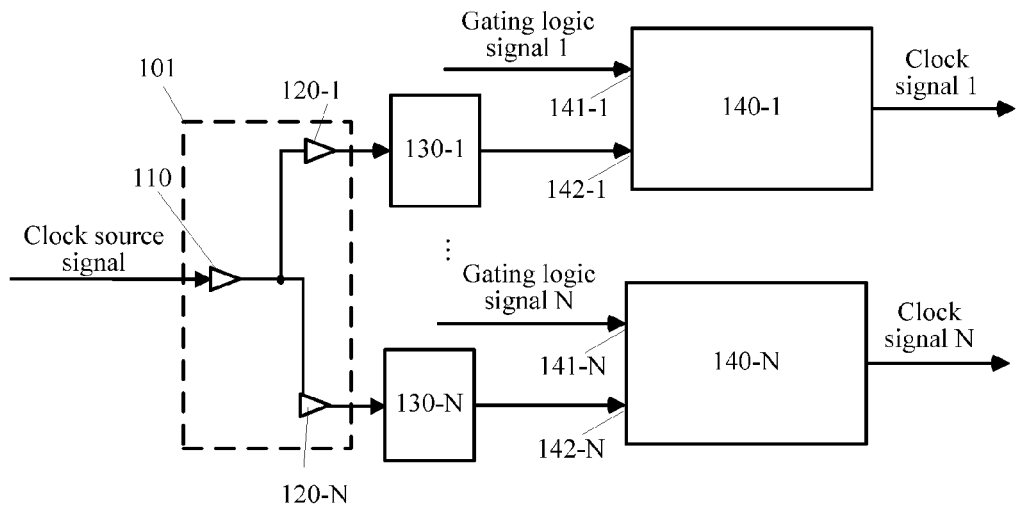
FIG. 1 is a schematic structural diagram of a clock circuit in the prior art.
FIG. 2 is a schematic structural diagram of a clock circuit according to an embodiment of the present invention.

For a better understanding of the clock circuit in the embodiments of the present invention, a conventional clock circuit is first described below according to a circuit structure shown in FIG. 1. In FIG. 1, only a case in which a clock source signal is output to two loads is exemplarily shown, but an actual clock circuit may have multiple or even hundreds of loads, and correspondingly have multiple or even hundreds of clock paths.

As shown in FIG. 1, on the Nth clock path, an input clock source signal travels through a buffer no and a buffer 120-N in a buffer module 101, and a driving capability of the clock source signal is enhanced. The clock source signal that is output from the buffer 120-N is then input to a frequency division unit 130-N (such as a frequency division quantity register), and processed by the frequency division unit 130-N according to a requirement, and a clock signal obtained after frequency division is output (for example, if the frequency division quantity register is set to 3, a clock signal whose frequency is divided by 3 is output). The clock signal obtained after the frequency division and output by the frequency division unit 130-N is input to a data end 142-N of a clock gating cell 140-N. An enabling end 141-N of the clock gating cell 140-N receives a gating logic signal N. The clock gating cell 140-N outputs a clock signal N from an output end according to the gating logic signal N received by the enabling end 141-N. For example, when the gating logic signal N is a high level, the output end of the clock gating cell 140-N outputs the clock signal that is input from the data end 142-N, and when the gating logic signal is a low level, the output end of the clock gating cell 140-N keeps outputting a low level, that is, no clock signal is output in this case.

In the clock circuit provided in FIG. 1, a clock signal on each path needs to travel through a frequency division unit and a clock gating cell before arriving at a load, resulting in an excessively long path, which leads to that a travel latency of the clock signal is excessively long, and power consumption in the clock path increases.

With rapid development of integrated circuit technologies, high-performance chips have increasingly high requirements on clock latency, and therefore have increasingly high requirements on a clock circuit structure. To resolve the problem in the conventional clock circuit, an embodiment of the present invention provides a clock circuit shown in FIG. 2.

The clock circuit in this embodiment of the present invention shown in FIG. 2 includes a buffer module 110, N first multiplexers (120-1 to 120-N), and N clock gating cells (130-1 to 130-N), where N is a positive integer.

The buffer module no includes an input end 111 and N output ends (112-1 to 112-N). The input end 111 is configured to receive an input clock signal and the N output ends (112-1 to 112-N) are configured to output the clock signal. The N output ends (112-1 to 112-N) are connected to data ends (132-1 to 132-N) of the N clock gating cells (130-1 to 130-N) one to one. The buffer module no is configured to enhance a driving capability of the clock signal that is input from the input end 111, and output the clock signal whose driving capability is enhanced from the N output ends (112-1 to 112-N). Output ends (124-1 to 124-N) of the N multiplexers (120-1 to 120-N) are connected to enabling ends (131-1 to 131-N) of the N clock gating cells one to one.

The N multiplexers (120-1 to 120-N) are configured to choose, according to logic selection signals (a logic selection signal 1 to a logic selection signal N) received by address input ends (123-1 to 123-N), whether to output, from the output ends (124-1 to 124-N), gating logic signals (a gating logic signal 1 to a gating logic signal N) received by first data input ends (121-1 to 121-N) or frequency division logic signals (a frequency division logic signal 1 to a frequency division logic signal N) received by second data input ends (122-1 to 122-N). The N clock gating cells (130-1 to 130-N) are configured to output clock signals (an output clock signal 1 to an output clock signal N) from output ends (133-1 to 133-N) according to the frequency division logic signals (the frequency division logic signal 1 to the frequency division logic signal N) or the gating logic signals (the gating logic signal 1 to the gating logic signal N) received by the enabling ends (131-1 to 131-N) from the output ends (124-1 to 124-N) of the corresponding multiplexers and the clock signals received by the data ends (132-1 to 132-N) from the output ends (112-1 to 112-N) of the buffer module 110.

In the clock circuit provided in FIG. 2, after an input clock signal is input to the buffer module no from the input end 111 of the buffer module no, the input clock signal is output to the data ends (132-1 to 132-N) of the N clock gating cells (130-1 to 130-N) through the N output ends (112-1 to 112-N). The input clock signal may be a clock source signal provided by a crystal oscillator. How a clock gating cell outputs a clock signal received by an input end is described below by using the first multiplexer 120-1 and the first clock gating cell 130-1 as an example.

After an input clock signal is input to the buffer module no from the input end 111 of the buffer module no, the input clock signal is output to the data end 132-1 of the first clock gating cell 130-1 through the first output end 112-1. In this case, if a clock signal obtained after frequency division is performed on the clock signal that is input from the data end 132-1 needs to be output from the output end 133-1 of the clock gating cell 130-1, in this case, the frequency division logic signal 1 is input from the second data input end 122-1 of the multiplexer 120-1, and the logic selection signal 1 is input from the address input end 123-1 of the multiplexer 120-1, where the logic selection signal 1 controls the multiplexer 120-1 to choose to output, from the output end 124-1, the frequency division logic signal 1 input from the second data input end 122-1. In this case, the gating logic signal 1 may be input from the first data input end 121-1 of the multiplexer 120-1, or the gating logic signal 1 may not be input. Because the logic selection signal 1 controls the multiplexer 120-1 to choose to output, from the output end 124-1, the frequency division logic signal 1 input from the second data input end 122-1, whether there is a gating logic signal input from the first data input end 121-1 does not matter.

If the frequency division logic signal 1 output from the output end 124-1 of the multiplexer 120-1 is input to the enabling end 131-1 of the clock gating cell 130-1, the frequency division logic signal 1 controls the clock gating cell 130-1 to output, from the output end 133-1, the clock signal that is input from the data end 132-1, or suspend outputting the clock signal that is input from the data end 132-1, so that the output clock signal 1 output from the output end 133-1 is the clock signal obtained after the frequency division is performed on the clock signal that is input from the data end 132-1.

Figure 3:
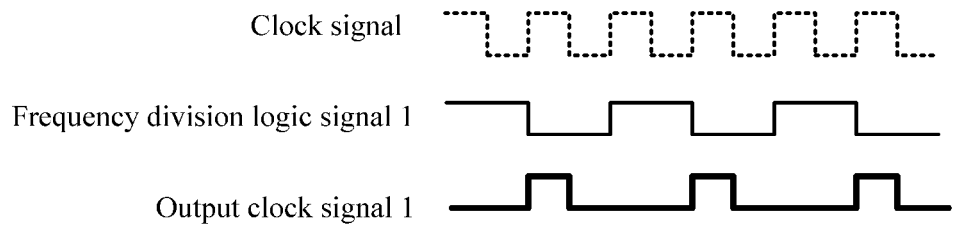
FIG. 3 is a schematic sequence diagram according to an embodiment of the present invention.

As shown in FIG. 3, a dashed line represents the clock signal that has a duty ratio of 1:1 and that is received by the data end 132-1 of the clock gating cell 130-1, a thin solid line represents the frequency division logic signal 1 received by the enabling end 131-1 of the clock gating cell 130-4 and a thick solid line represents the output clock signal 1 output from the output end 133-1 of the clock gating cell 130-1. The clock gating cell 130-1 is enabled by a high level. Therefore, when the frequency division logic signal 1 is a low level, the output clock signal 1 is a low level, and when the frequency division logic signal 1 is a high level, the output end outputs a clock signal. The clock gating cell 130-1 finally outputs, from the output end 133-1 according to the frequency division logic signal received by the enabling end 131-1 and the clock signal received by the data end 132-1, a frequency-halved clock signal having a duty ratio of 1:3.

If the clock signal obtained after the frequency division is performed on the clock signal that is input from the data end 132-1 or the clock signal received by the data end 132-1 temporarily does not need to be output from the output end 133-1 of the clock gating cell 130-1, in this case, the gating logic signal 1 is input from the first data input end 121-1 of the multiplexer 120-1, and the logic selection signal 1 is input from the address input end 123-1 of the multiplexer 120-1, where the logic selection signal 1 controls the multiplexer 120-1 to choose to output, from the output end 124-1, the gating logic signal 1 input from the first data input end 121-1. In this case, the frequency division logic signal 1 may be input from the second data input end 122-1 of the multiplexer 120-1, or the frequency division logic signal 1 may not be input. Because the logic selection signal 1 controls the multiplexer 120-1 to choose to output, from the output end 124-1, the gating logic signal 1 input from the first data input end 121-1, whether there is a frequency division logic signal input from the second data input end 122-1 does not matter.

Figure 4:
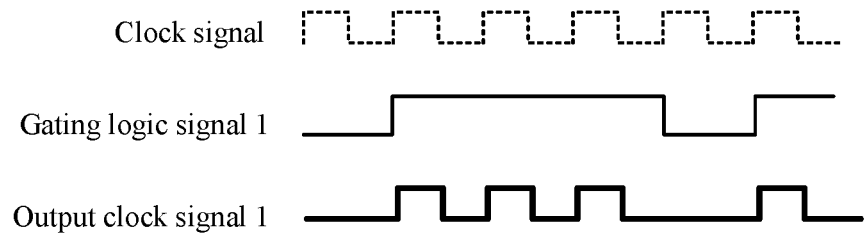
FIG. 4 is a schematic sequence diagram according to another embodiment of the present invention.

As shown in FIG. 4, a dashed line represents the clock signal that has a duty ratio of 1:1 and that is received by the data end 132-1 of the clock gating cell 130-1, a thin solid line represents the frequency division logic signal 1 received by the enabling end 131-1 of the clock gating cell 130-1, and a thick solid line represents the output clock signal 1 output from the output end 133-1 of the clock gating cell 130-1. The clock gating cell 130-1 is enabled by a high level. Therefore, when the frequency division logic signal 1 is a low level, the output clock signal 1 is a low level, and when the frequency division logic signal 1 is a high level, the output end outputs a clock signal 101010.

In this embodiment of the present invention, the gating logic signals, the frequency division logic signals, and the logic selection signals received by the N multiplexers may be all different, or may be partially the same, or even may be all the same.

The gating logic signals and the frequency division logic signals in this embodiment of the present invention may be output to the N multiplexers (120-1 to 120-N) according to a requirement by a control module on a chip on which the clock circuit is disposed.

According to the clock circuit in this embodiment of the present invention, after traveling through a buffer module, an input clock signal only needs to travel through a clock gating cell before a clock signal obtained after frequency division is performed is output according to a frequency division logic signal or a clock signal is output or clock signal output is suspended according to a gating logic signal. Therefore, a clock path can be shortened, and a transmission latency of the clock signal can be reduced and power consumption of the clock circuit can be reduced. In addition, a clock variation and an on-chip variation can be reduced, and when a frequency division ratio is n, a clock signal having a duty ratio of $1:(2*n-1)$ can be output.

On the other hand, in the conventional clock circuit, some paths may include only a clock gating cell, while some paths may not only include a clock gating cell but also include a frequency division unit, which causes that path lengths of different paths are different. To ensure that path lengths of different paths are the same, in the conventional clock circuit, a buffer is added in a clock path having a short path length, which increases power consumption of the clock circuit. However, in this embodiment of the present invention, after the clock signal is output from the buffer module, no additional buffer needs to be added. Therefore, power consumption can be further reduced.

Figure 5:
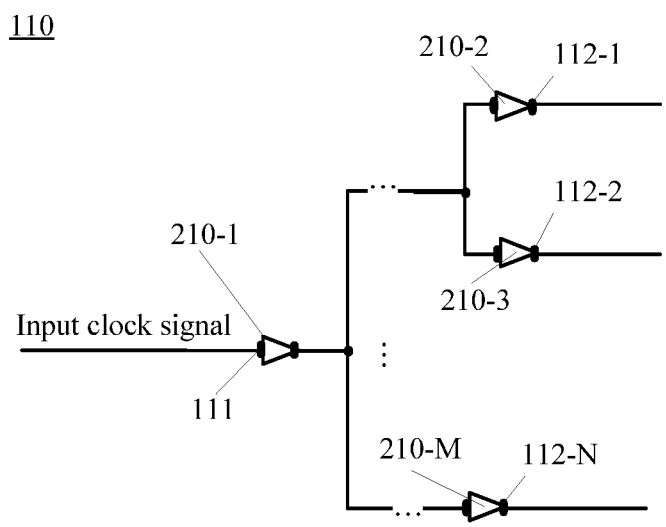
FIG. 5 is a schematic structural diagram of a buffer module according to an embodiment of the present invention.

As shown in FIG. 5, the buffer module no in the clock circuit provided in FIG. 2 may have a tree-shaped clock structure formed by M buffers, where the tree-shaped clock structure has a root node and N leaf nodes, and paths between the root node and all of the N leaf nodes have an equal length. An input end of a buffer 210-1 at a position of the root node is the input end in of the buffer module 110, and is configured to receive an input clock signal, where the input clock signal is generally a high-frequency signal. Output ends of N buffers (210-2, 210-3, . . . , and 210-M) at positions of the N leaf nodes are the N output ends (112-1 to 112-N) of the buffer module 110, and are connected to the data ends of the N clock gating cells one to one. Quantities of buffers between the buffer 210-1 at the position of the root node and the N buffers (210-2, 210-3, . . . , and 210-N) at the positions of the N leaf nodes are the same.

The M buffers included in the buffer module no can enhance a driving capability of a clock signal received by the input end 111, and then the clock signal is output to the data ends (132-1 to 132-N) of the N clock gating cells from the N output ends (112-1 to 112-N).

After a chip integrating a clock circuit is manufactured, the chip generally needs to be tested. Therefore, the clock circuit may further transmit a testing clock signal to complete the test.

Figure 6:
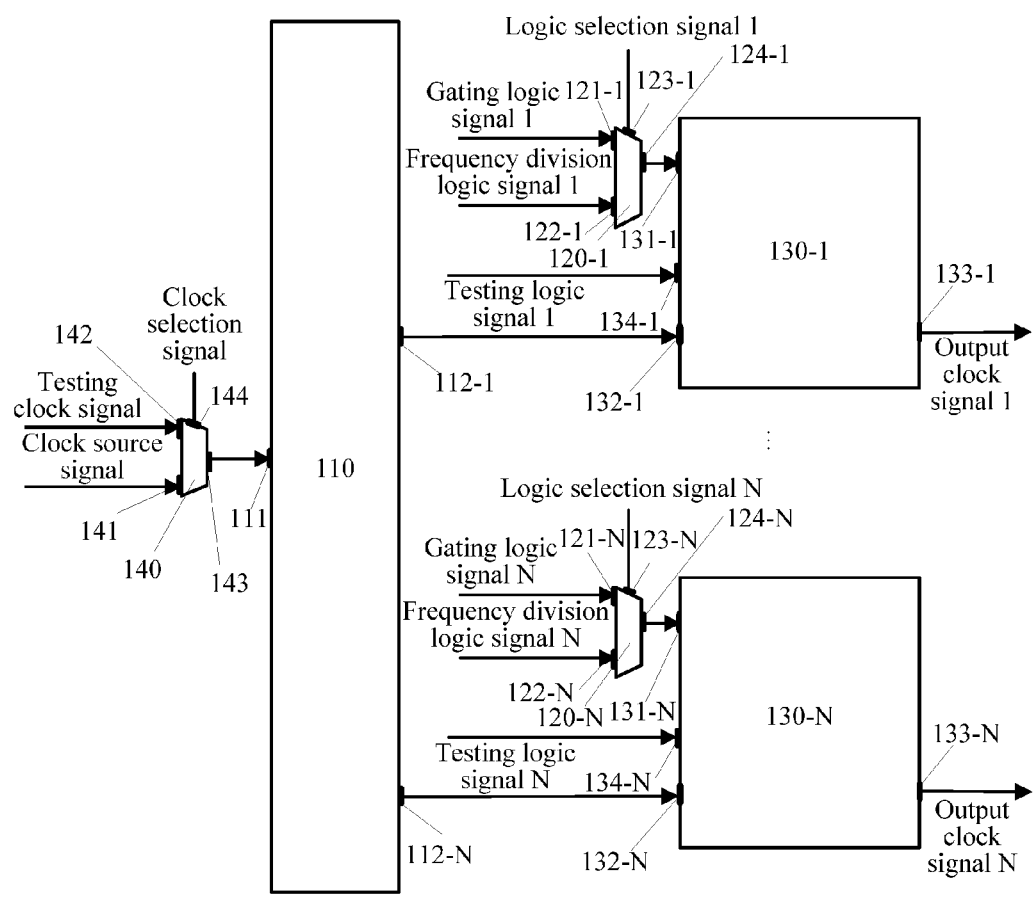
FIG. 6 is a schematic structural diagram of a clock circuit according to another embodiment of the present invention.

FIG. 6 shows a clock circuit according to another embodiment of the present invention. Same processing modules and units and signals represent same meanings in the clock circuit shown in FIG. 6 and the clock circuit shown in FIG. 2, and are not described herein again. Compared with the clock circuit shown in FIG. 2, the clock circuit shown in FIG. 6 further includes a multiplexer 140. An output end 143 of the multiplexer 140 is connected to the input end in of the buffer module.

In the clock circuit shown in FIG. 6, testing enabling ends (134-1 to 134-N) of the clock gating cell 130-1 to the clock gating cell 130-N are configured to receive testing logic signals (a testing logic signal 1 to a testing logic signal N). An address input end 144 of the multiplexer 140 is configured to input a clock selection signal, a first data input end 142 of the multiplexer 140 is configured to receive a testing clock signal, and a second data input end 141 of the multiplexer 140 is configured to receive a clock source signal, where the testing clock signal is generally a low-frequency signal.

When the clock circuit shown in FIG. 6 transmits a clock signal, there may be an operating mode and a testing mode. In the operating mode, the multiplexer chooses, according to the clock selection signal received by the address input end 144, to output, from the output end 143, the clock source signal received by the second data input end 141, and the clock source signal is input to the N clock gating cells (130-1 to 130-N) through the buffer module no. After the data ends (132-1 to 132-N) of the N clock gating cells (130-1 to 130-N) receive the clock signal that is output by the buffer module no, an operating principle is the same as that of the clock circuit shown in FIG. 2, and is not described herein again.

In the testing mode, the multiplexer 140 chooses, according to the clock selection signal that is input from the address input end 144, to output, from the output end 143, the testing clock signal received by the first data input end 142, where the testing clock signal is generally input, by a testing control module external to a chip on which the clock circuit is disposed, through a pin of the chip, and is generally a low-frequency signal. The testing clock signal travels through the buffer module no, and after being output by the N output ends (112-1 to 112-N) of the buffer module no, the testing clock signal is then input from the input ends 132-1 to 132-N of the clock gating cell 130-1 to the clock gating cell 130-N. In this case, testing logic signals (a testing logic signal 1 to a testing logic signal N) are input from the testing enabling ends 134-1 to 134-N of the clock gating cell 130-1 to the clock gating cell 130-N. The N testing logic signals are also input through a pin of the chip by the testing control module external to the chip, and the N testing logic signals may be all the same, or may be partially the same, or all different. The address input ends, the first data input ends, and the second data input ends of the N multiplexers (120-1 to 120-N) all may not input a logic signal.

After receiving testing logic signals, the testing enabling ends 134-1 to 134-N of all or some of the clock gating cell 130-1 to the clock gating cell 130-N output, from the output ends (132-1 to 132-N) according to the respectively received testing logic signals, the testing clock signals received by the data ends (132-1 to 132-N), or suspend outputting the testing clock signals received by the data ends (132-1 to 132-N). A sequence of the testing clock signal received by the data end of the clock gating cell 130-1, the testing logic signal 1 received by the testing enabling end 134-1, and the output clock signal 1 output by the output end 133-1 may be shown in FIG. 4.

According to the clock circuit in this embodiment of the present invention, not only a clock source signal may be input, but also a testing clock signal may be input, so that a clock gating cell may output, in an operating mode according to a gating logic signal or a frequency division logic signal, a clock signal corresponding to the clock source signal, and the clock gating cell may output or suspend outputting the testing clock signal in a testing mode according to a testing logic signal.

In the clock circuits in the foregoing embodiments of the present invention, multiple clock gating cells having different structures may be used. In the clock circuit shown in FIG. 2, a simplest clock gating cell may be a two-input AND gate. One input end of the AND gate is an enabling end, and is configured to receive a gating logic signal or a frequency division logic signal that is output by an output end of a multiplexer connected to the enabling end; the other input end of the AND gate is a data end, and is configured to receive a clock signal that is output by an output end of a buffer connected to the data end.

In the clock circuit shown in FIG. 6, a simplest clock gating cell may include an OR gate and an AND gate. One input end of the OR gate is an enabling end, and is configured to receive a gating logic signal or a frequency division logic signal that is output by an output end of a multiplexer connected to the enabling end; the other input end of the OR gate is a testing enabling end, and is configured to receive a testing logic signal. An output end of the OR gate is connected to an input end of the AND gate, and the other input end of the AND gate is a data end, and is configured to receive a clock signal that is output by an output end of a buffer connected to the data end.

However, generally, to ensure quality of a clock signal, an LAT-based clock gating cell is generally used. A common LAT-based clock gating cell includes an ICGC, where the ICGC may also be referred to as an ICGU (Integrated Clock Gating Unit). The ICGC may be a clock gating cell enabled by a high level, that is, when a clock signal received by a data end is a high level, an output end outputs a gating logic signal received by an enabling end, and when the clock signal received by the data end is a low level, the output end continues to output a gating logic signal that is received by the enabling end at a preceding moment. Alternatively, the ICGC may be a clock gating cell enabled by a low level. In this case, an operating principle of the ICGC is reverse to that of an ICGC enabled by a high level.

Figure 7:
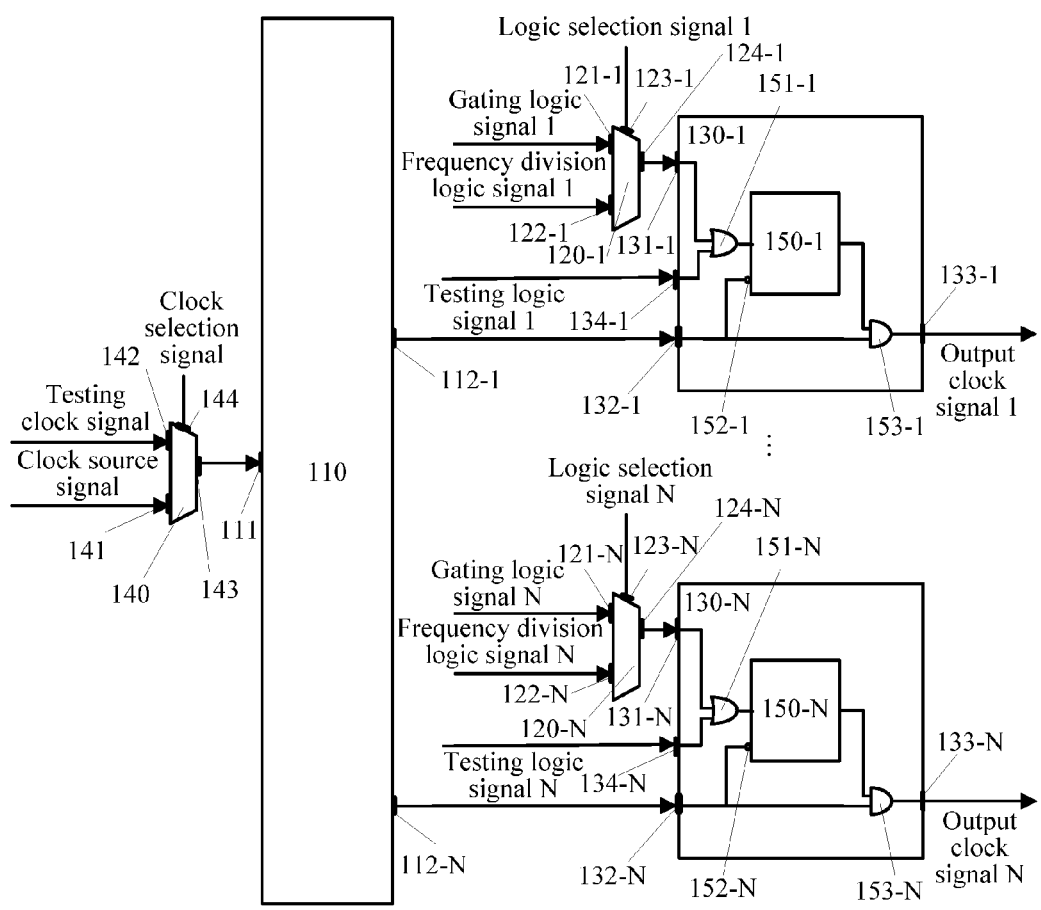
FIG. 7 is a schematic structural diagram of a clock circuit according to another embodiment of the present invention.

A schematic clock circuit structure when the clock gating cell in the clock circuit shown in FIG. 6 is an ICGC is shown in FIG. 7.

In FIG. 7, the N clock gating cells (130-1 to 130-N) include OR gates (151-1 to 151-N), LATs (150-1 to 150-N), NOT gates (152-1 to 152-N), and AND gates (153-1 to 153-N). In each clock gating cell, an output end of an OR gate is connected to an input end of an LAT, an output end of the LAT is connected to an output end of an AND gate, an output end of a NOT gate is connected to the other input end of the LAT, and the output end of the NOT gate is connected to the other input end of the AND gate.

One input end of the OR gate of each clock gating cell is used as an enabling end of the clock gating cell, connected to an output end of a corresponding multiplexer 1, and configured to receive a gating logic signal or a frequency division logic signal that is output by the multiplexer. The other input end of the OR gate is used as a testing enabling end of the clock gating cell, and configured to receive a testing logic signal. An end formed after the NOT gate and the AND gate are connected is connected to an output end of a corresponding buffer, used as a data end of the clock gating cell, and configured to receive a clock source signal or a testing clock signal. The output end of the AND gate is used as an output end of the clock gating cell, and is configured to output a clock signal to a load.

A clock signal frequency division process when a clock gating cell is an ICGC is described below by using the multiplexer 120-1 and the clock gating cell 130-1 (it is assumed that the clock gating cell 130-1 is an ICGC enabled by a low level) as an example with reference to the sequence diagram shown in FIG. 3.

The frequency division logic signal 1 received by the second data end 122-1 of the multiplexer 120-1 is the frequency division logic signal 1 shown in FIG. 3. The multiplexer 120-1 chooses, according to the logic selection signal 1 received by the address end 123-1, to output the frequency division logic signal 1 from the output end 124-1. The frequency division logic signal 1 is input to an input end of the OR gate 151-1.

When a clock signal that is input from the data end 132-1 of the clock gating cell 130-1 is the first low level in the clock signal shown in FIG. 3, the low level is input to the NOT gate 151-1 and then becomes a high level and is input to the LAT 150-1, so that an output end of the LAT 150-1 outputs the second high level in the frequency division logic signal 1 received by the OR gate 151-1, and after the high level that is output from the output end of the LAT 150-1 and the low level received by the data end 132-1 are input to the AND gate 153-1 at the same time, an output end of the AND gate 153-1 outputs a low level, that is, the output end 133-1 of the clock gating cell 130-1 outputs the second low level in the output clock signal in FIG. 3. When a clock signal that is input from the data end 132-1 of the clock gating cell 130-1 is the second high level in the clock signal shown in FIG. 3, the high level is input to the NOT gate 151-1 and then becomes a low level and is input to the LAT 150-1, so that the output end of the LAT 150-1 outputs a high level that is received by the OR gate 151-1 at a preceding moment, and after the high level that is output from the output end of the LAT 150-1 and the high level received by the data end 132-1 are input to the AND gate 153-1 at the same time, the output end of the AND gate 153-1 outputs a high level, that is, the output end 133-1 of the data end 132-1 outputs the first high level in the output clock signal in FIG. 3.

According to the foregoing operating principle of the clock gating cell 130-1, when a clock signal that is input from the data end 132-1 of the clock gating cell 130-1 is the fourth high level in the clock signal shown in FIG. 3, the output end of the LAT 150-1 outputs the fourth high level in the frequency division logic signal 1 received by the OR gate 151-1, and after the high level that is output from the output end of the LAT 150-1 and the high level received by the data end 132-1 are input to the AND gate 153-1 at the same time, the output end of the AND gate 153-1 outputs a high level, that is, the output end 133-1 of the data end 132-1 outputs the second high level in the output clock signal in FIG. 3. When a clock signal that is input from the data end 132-1 of the clock gating cell 130-1 is the sixth high level in the clock signal shown in FIG. 3, the output end of the LAT 150-1 outputs the sixth high level in the frequency division logic signal 1 received by the OR gate 151-1, and after the high level that is output from the output end of the LAT 150-1 and the high level received by the data end 132-1 are input to the AND gate 153-1 at the same time, the output end of the AND gate 153-1 outputs a high level, that is, the output end 133-1 of the data end 132-1 outputs the third high level in the output clock signal in FIG. 3.

If the gating logic signal 1 received by the first data end 121-1 of the multiplexer 120-1 is the gating logic signal 1 shown in FIG. 4, the multiplexer 120-1 chooses, according to the logic selection signal 1 received by the address end 123-1, to output the gating logic signal 1 from the output end 124-1. The gating logic signal 1 is input to an input end of the OR gate 151-1. Then the input end 132-1 of the clock gating cell 130-1 receives the clock signal shown in FIG. 4, and a frequency division process is the same as that described above. The output end of the AND gate 153-1 in the clock gating cell 130-1 outputs the output clock signal 1 shown in FIG. 4, that is, the output end 133-1 of the clock gating cell 130-1 outputs the output clock signal shown in FIG. 4.

In the clock circuit in this embodiment of the present invention, an ICGC is used as a clock gating cell, which not only can reduce an area of a chip, but also can improve quality of a clock signal. Moreover, the clock circuit of the present invention can output a frequency division clock signal having a duty ratio of $1:(2n-1)$, where n is great than or equal to 1.

In this embodiment of the present invention, the M buffers may form the buffer module no having an H-shaped tree-shaped network structure.

Figure 8:
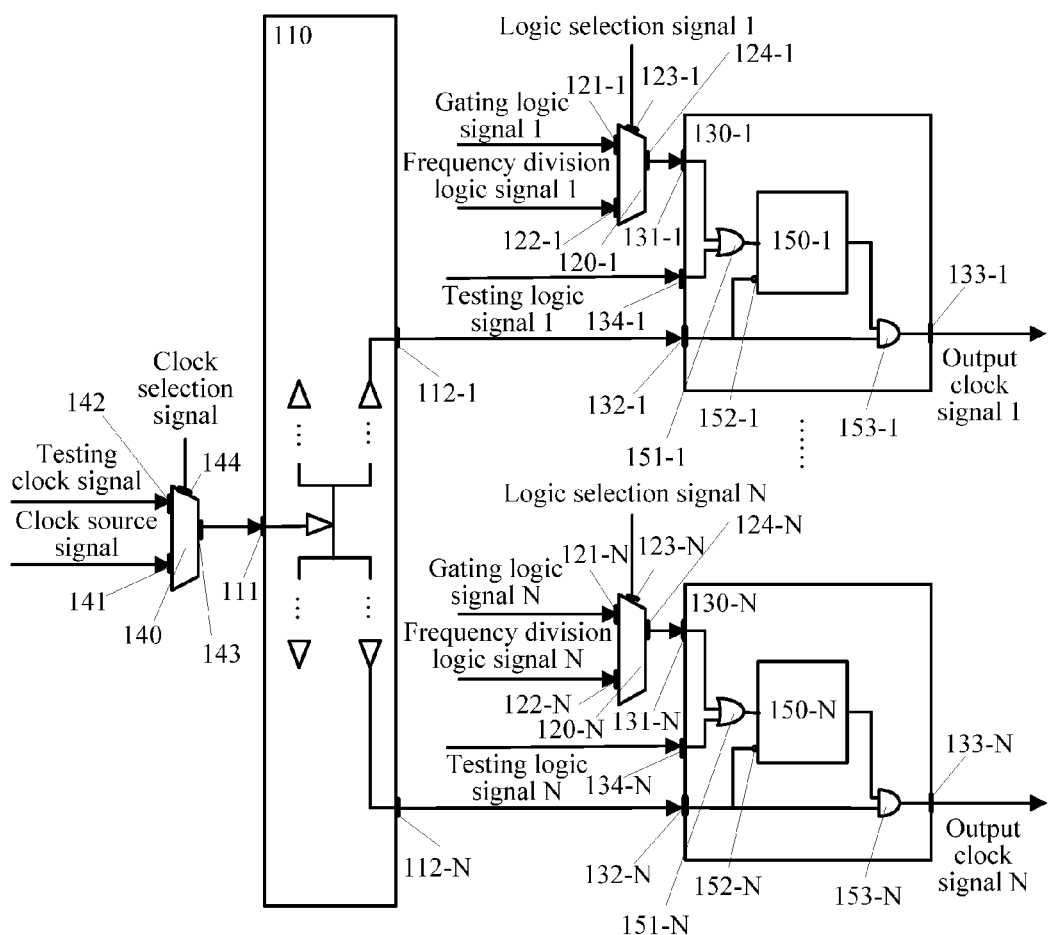
FIG. 8 is a schematic structural diagram of a clock circuit according to another embodiment of the present invention.

A schematic structural diagram when the buffer module in the clock circuit shown in FIG. 7 has an H-shaped clock network structure is shown in FIG. 8.

The buffer module no in FIG. 8 has an H-shaped clock network structure formed by buffers, where a data end of each clock gating cell is connected to a leaf node in the H-shaped clock network structure. The H-shaped clock network structure is a hierarchical structure, and paths are highly corresponding. An H tree needs a symmetrical ideal structure, and requires all levels to have entirely same clock buffer units.

In the clock circuit in this embodiment of the present invention, a high-layer metal and a buffer having strong driving power may be used for the H-shaped clock network structure. In this way, a driving distance of a single buffer is greatly increased, which can shorten a path length of each clock path in the buffer module, and can further reduce clock latency and improve clock quality.

Alternatively, the H-shaped clock network structure may use, for example, a low-layer metal, but effects of reducing a latency and improving clock quality when a low-layer metal is used may be worse than those achieved when a high-layer metal is used.

The embodiments of the clock circuit of the present invention are described above with reference to FIG. 2 to FIG. 8, and an embodiment of the present invention in which the clock circuit in FIG. 2 to FIG. 8 is used for clock signal transmission is described below with reference to FIG. 9.

Figure 9:
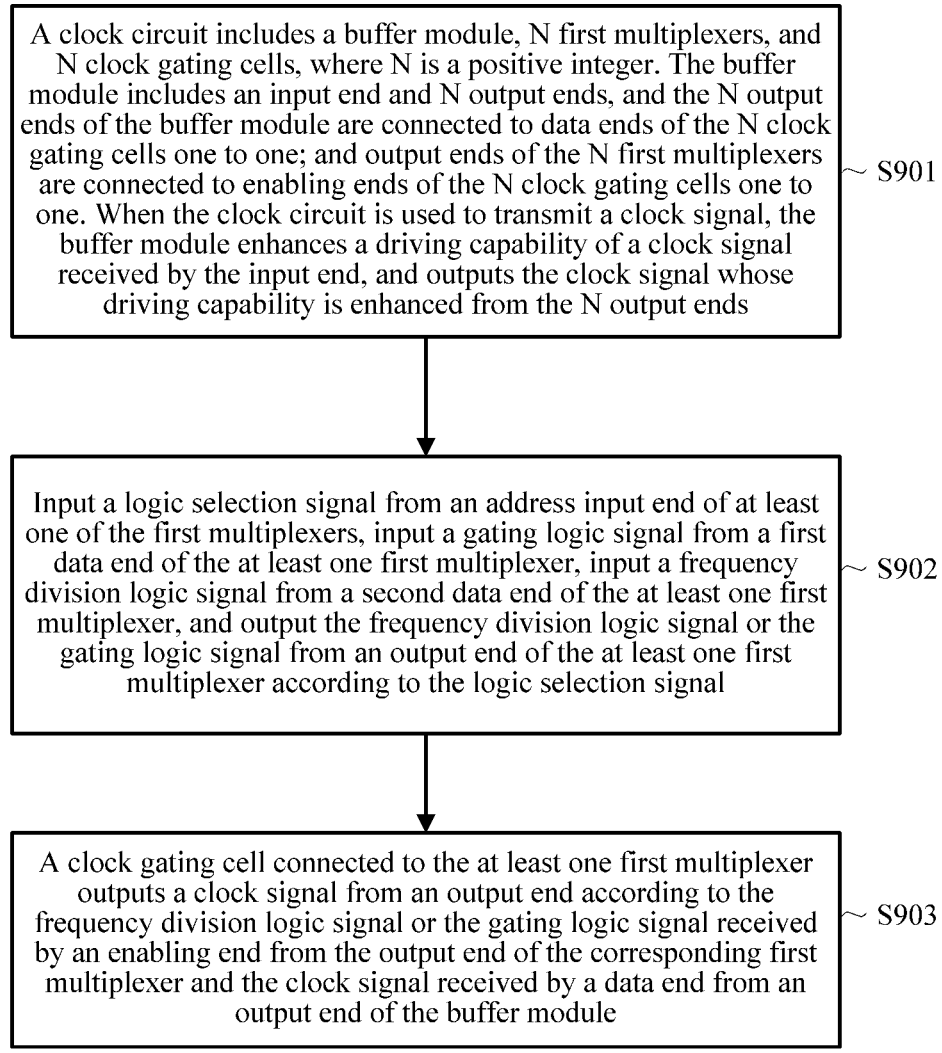
FIG. 9 is a schematic flowchart of a clock signal transmission method according to an embodiment of the present invention.

FIG. 9 is a schematic flowchart of a clock signal transmission method according to an embodiment of the present invention.

A clock circuit includes a buffer module, N first multiplexers, and N clock gating cells, where N is a positive integer. The buffer module includes an input end and N output ends, and the N output ends of the buffer module are connected to data ends of the N clock gating cells one to one; and output ends of the N first multiplexers are connected to enabling ends of the N clock gating cells one to one. When the clock circuit is used to transmit a clock signal, the buffer module enhances a driving capability of a clock signal received by the input end, and outputs the clock signal whose driving capability is enhanced from the N output ends.

Input a logic selection signal from an address input end of at least one of the first multiplexers, input a gating logic signal from a first data end of the at least one first multiplexer, input a frequency division logic signal from a second data end of the at least one first multiplexer, and output the frequency division logic signal or the gating logic signal from an output end of the at least one first multiplexer according to the logic selection signal.

A clock gating cell connected to the at least one first multiplexer outputs a clock signal from an output end according to the frequency division logic signal or the gating logic signal received by an enabling end from the output end of the corresponding first multiplexer and the clock signal received by a data end from an output end of the buffer module.

According to the clock signal transmission method of the present invention, a clock source signal is directly input to a clock gating cell, and then the clock gating cell outputs the clock source signal according to a frequency division logic signal and a gating logic signal that a multiplexer chooses to output, so that the clock source signal can arrive at a load through only one level of clock gating cell. Therefore, a clock path is shortened, and it is ensured that clock path lengths on different paths are the same, so that a transmission latency, a clock variation, and an on-chip variation of the clock source signal can be reduced, and power consumption of a clock circuit can be reduced.

It should be understood that, the clock signal transmission method in this embodiment of the present invention shown in FIG. 9 may correspond to the clock circuits in FIG. 2 to FIG. 8, and the clock signal transmission method in this embodiment of the present invention may implement the foregoing and/or other functions of the units in the clock circuits shown in FIG. 2 to FIG. 8, which are not described herein again for brevity.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of the present invention. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A clock circuit, comprising:
   a buffer module, comprising comprises an input end and N output ends;
   N first multiplexers; and
   N clock gating cells, wherein N is a positive integer;
   wherein the buffer module is configured to enhance a driving capability of a clock signal received by the input end, and output the clock signal whose driving capability is enhanced from the N output ends, and the N output ends of the buffer module are connected to data ends of the N clock gating cells in a one to one correspondence;
   wherein output ends of the N first multiplexers are connected to enabling ends of the N clock gating cells in a one to one correspondence, and each first multiplexer of the N first multiplexers is configured to choose, according to a logic selection signal received by an address input end, whether to output, from an output end, a gating logic signal received by a first data input end or a frequency division logic signal received by a second data input end; and each clock gating cell of the N clock gating cells is configured to output a clock signal from an output end according to a frequency division logic signal or a gating logic signal received by an enabling end from an output end of a corresponding first multiplexer and the clock signal received by a data end from an output end of the buffer module.

2. The clock circuit according to claim 1, wherein the buffer module further comprises M buffers, wherein M is a positive integer that is greater than or equal to N, the M buffers form a tree-shaped clock structure having a root node and N leaf nodes, and paths between the root node and all the N leaf nodes have an equal length; and wherein an input end of a buffer at a position of the root node is the input end of the buffer module, and output ends of N buffers at positions of the N leaf nodes are the N output ends of the buffer module.

3. The clock circuit according to claim 2, wherein the tree-shaped clock structure is an H-shaped clock network structure.

4. The clock circuit according to claim 3, wherein a high-layer metal is used for the H-shaped clock network.

5. The clock circuit according to claim 1, wherein the clock circuit further comprises a second multiplexer;

wherein an output end of the second multiplexer is connected to the input end of the buffer module, and the second multiplexer is configured to choose, according to a clock selection signal received by an address input end, whether to output, from the output end, a clock source signal received by a first data input end or a testing clock signal received by a second data input end;

wherein the input end of the buffer module is configured to receive the clock source signal or the testing clock signal that is output from the output end of the second multiplexer;

and wherein each clock gating cell is configured to:

when the second multiplexer chooses to output the testing clock signal from the output end, output a clock signal from the output end of each clock gating cell of the N clock gating cells according to a testing logic signal received by the testing enabling end and the testing clock signal received by the data end from the output end of the buffer module; and when the second multiplexer chooses to output the clock source signal from the output end, output a clock signal from the output end of each clock gating cell according to the frequency division logic signal or the gating logic signal received by the enabling end from the output end of the corresponding first multiplexer and the clock source signal received by the data end from the output end of the buffer module.

6. The clock circuit according to claim 1, wherein each clock gating cell is an integrated clock gating cell (ICGC).

7. A method, wherein the method is applied to a clock circuit, wherein the clock circuit comprises a buffer module, N first multiplexers, and N clock gating cells, wherein N is a positive integer, and the method comprises:

inputting a clock signal from an input end of the buffer module, wherein the buffer module comprises the input end and N output ends, and the N output ends of the buffer module are connected to data ends of the N clock gating cells in a one to one correspondence;

enhancing, by the buffer module, a driving capability of the clock signal received by the input end of the buffer module, and outputting the clock signal whose driving capability is enhanced from the N output ends of the buffer module;

inputting a logic selection signal from an address input end of at least one of the N first multiplexers, inputting a gating logic signal from a first data end of the at least one of the N first multiplexers, inputting a frequency division logic signal from a second data end of the at least one of the N first multiplexers;

outputting the frequency division logic signal or the gating logic signal from an output end of the at least one of the N first multiplexers according to the logic selection signal, wherein output ends of the N first multiplexers are connected to enabling ends of the N clock gating cells in a one to one correspondence; and outputting, by a clock gating cell connected to the at least one of the N first multiplexers, a clock signal from an output end according to the frequency division logic signal or the gating logic signal received by an enabling end from the output end of the corresponding first multiplexer and the clock signal received by a data end from an output end of the buffer module.

8. The method according to claim 7, wherein the buffer module further comprises M buffers, wherein M is a positive integer that is greater than or equal to N, the M buffers form a tree-shaped clock structure having a root node and N leaf nodes, and paths between the root node and all the N leaf nodes have an equal length; and wherein an input end of a buffer at a position of the root node is the input end of the buffer module, and output ends of N buffers at positions of the N leaf nodes are the N output ends of the buffer module.

9. The method according to claim 8, wherein the tree-shaped clock structure is an H-shaped clock network structure.

10. The method according to claim 9, wherein a high-layer metal is used for the H-shaped clock network.

11. The method according to claim 7, wherein the clock circuit further comprises a second multiplexer, wherein an output end of the second multiplexer is connected to the input end of the buffer module, and the method further comprises:

inputting a clock selection signal from an address input end of the second multiplexer, inputting a clock source signal from a first data input end of the second multiplexer, inputting a testing clock signal from a second data input end of the second multiplexer, and outputting the clock source signal or the testing clock signal from the output end;

receiving, by the input end of the buffer module, the clock source signal or the testing clock signal that is output from the output end of the second multiplexer;

when the second multiplexer outputs the testing clock signal from the output end, outputting, by the clock gating cell connected to the at least one of the N first multiplexers, a clock signal from the output end of the clock gating cell according to a testing logic signal received by the testing enabling end and the testing clock signal received by the data end from the output end of the buffer module; and when the second multiplexer outputs the clock source signal from the output end, outputting, by the clock gating cell connected to the at least one of the N first multiplexers, a clock signal from the output end of the clock gating cell according to the frequency division logic signal or the gating logic signal received by the enabling end from the output end of the corresponding first multiplexer and the clock source signal received by the data end from the output end of the buffer module.

12. The method according to claim 7, wherein each clock gating cell is an integrated clock gating cell (ICGC).

* * * * *